(12) United States Patent
Bem et al.

(10) Patent No.: US 7,041,172 B2
(45) Date of Patent: May 9, 2006

(54) METHODS AND APPARATUS FOR DISPENSING SEMICONDUCTOR PROCESSING SOLUTIONS WITH MULTI-SYRINGE FLUID DELIVERY SYSTEMS

(75) Inventors: Branko Bem, Newark, CA (US); Dikran Babikian, Millbrae, CA (US)

(73) Assignee: ASML Holding N.V., (NL)

( * ) Notice: Subject to any disclaimer, the term of this patent is extended or adjusted under 35 U.S.C. 154(b) by 0 days.

(21) Appl. No.: 10/372,028

(22) Filed: Feb. 20, 2003

(65) Prior Publication Data

US 2004/0248425 A1    Dec. 9, 2004

(51) Int. Cl.
*B05C 5/02* (2006.01)

(52) U.S. Cl. ................ 118/313; 118/319; 118/321; 118/323; 118/52; 222/386

(58) Field of Classification Search ........... 118/313, 118/319, 321, 323, 52; 430/324, 327; 396/611, 396/625; 901/43; 427/240; 222/386; 438/478
See application file for complete search history.

(56) References Cited

U.S. PATENT DOCUMENTS

| | | | |
|---|---|---|---|
| 5,002,008 A * | 3/1991 | Ushijima et al. ........... 118/313 |
| 5,212,050 A * | 5/1993 | Mier et al. ................ 430/320 |
| 5,803,970 A * | 9/1998 | Tateyama et al. ........... 118/319 |
| 6,059,880 A | 5/2000 | Kitano et al. .............. 118/52 |
| 6,063,190 A | 5/2000 | Hasebe et al. .............. 118/52 |
| 6,110,282 A | 8/2000 | Tateyama et al. ........... 118/712 |
| 6,113,695 A | 9/2000 | Fujimoto .................. 118/684 |
| 6,183,810 B1 | 2/2001 | Ota ........................ 427/240 |
| 6,193,783 B1 | 2/2001 | Sakamoto et al. ............ 95/26 |
| 6,200,633 B1 | 3/2001 | Kitano et al. .............. 427/240 |
| 6,267,516 B1 | 7/2001 | Nagamine et al. ........... 396/604 |
| 6,364,547 B1 | 4/2002 | Matsuyama et al. ......... 396/611 |
| 6,371,667 B1 | 4/2002 | Kitano et al. .............. 396/611 |
| 6,384,894 B1 | 5/2002 | Matsuyama et al. ......... 355/27 |
| 6,444,029 B1 | 9/2002 | Kimura et al. .............. 118/52 |
| 6,706,641 B1 * | 3/2004 | Worm et al. ............... 438/745 |
| 6,770,424 B1 | 8/2004 | Mandal et al. |

* cited by examiner

*Primary Examiner*—Laura Edwards
(74) *Attorney, Agent, or Firm*—Blakely, Sokoloff, Taylor & Zafman LLP

(57) ABSTRACT

Methods and apparatus for controllably dispensing photoresist solutions and other fluids in semiconductor manufacturing equipment from an array of syringe-based fluid dispensers. A multi-syringe fluid dispensing system is provided for photoresist coating within a wafer track coating module. The coating module may contain a spin chuck that is positioned within a catch cup. A robotic dispense arm and gripper assembly may be positioned within the coating module for gripping and positioning a fluid syringe. An array of syringes may be stored on a solution tray within the wafer track coating module for holding a plurality of fluid syringes containing photoresist solutions.

7 Claims, 15 Drawing Sheets

METHODS AND APPARATUS FOR DISPENSING SEMICONDUCTOR PROCESSING SOLUTIONS WITH MULTI-SYRINGE FLUID DELIVERY SYSTEMS

FIELD OF THE INVENTION

The invention relates to apparatus and methods for dispensing fluids used in semiconductor processing. More particularly, the invention relates to dispensing photoresist and other fluids using individual fluid dispensers.

BACKGROUND OF THE INVENTION

The photolithography process is an important technique used in forming selected circuit patterns on a semiconductor wafer. In general, a photoresist film can be deposited onto a substrate wafer during this process and thereafter pattern-exposed to lithographic equipment in order to transcribe a selected circuit pattern. The photoresist is subsequently developed with a developer solution to obtain a resist pattern corresponding to the transcribed pattern. The developer is intended to remove the relatively more soluble areas of photoresist, and leave behind the remaining patterned image which basically serves as a mask for etching multiple semiconductor wafer layers.

In order to form desired patterns on a substrate, the photoresist is processed during the development step with a solution that is applied in a highly controlled manner. Photoresist or resist development is carried out while a semiconductor wafer is rotated at various speeds and stopped intermittently at preselected time intervals for processing. For example, the wafer may be rotated while a developing solution is dispensed onto the wafer from the discharge port of a developer nozzle. A developing solution film may be thus formed which is intended to have a relatively uniform thickness across the surface of the wafer. Both the wafer and the developer film formed thereon are held stationary thereafter for a predetermined time interval so that developing solution remains in intimate contact with the resist-coated wafer in order to develop a light-exposed latent image thereon. Upon completion of this step in the development process, pure water or other rinse solution can be supplied from a washing liquid supplying nozzle onto the surface of the wafer. The pure water or rinse solution may be eventually scattered off by rotating the wafer at a relatively high speed to spin dry the surface of the wafer to complete this stage of wafer processing.

A variety of photoresist and developer materials are typically applied to the wafer using a spin coating technique. Either a photoresist or developer solution is sprayed or otherwise applied on the surface of the wafer and spun on a rotating chuck. The spinning of the wafer distributes the fluid over the surface of the substrate and exerts a shearing force that separates the excess fluid from the wafer thereby providing a thin layer or coating of photoresist, developer or any other type of processing solution. It is often desired to produce a highly uniform layer on the substrate without defects to enable the formation of subsequent layers to be precisely constructed thereon.

A significant problem associated with conventional solution dispense apparatus is their failure to prevent the inadvertent dripping of fluids onto processed wafers or substrates which can lead to defects. Following the spin-coating dispense of solutions using conventional liquid nozzles, residual amounts of fluid such as photoresist are often known to "drip" onto the underlying wafer. Drips of solution may also include certain added impurities residing on the surface of a nozzle body which can further contaminate the wafer. The occurrence of drips may result in uneven resist coating, developing defects, line width defects and shape failures and other undesirable consequences. While some fluid dispense systems today incorporate apparatus such as suck-back valves in an attempt to prevent drips, such equipment tends to add extra complexity in addressing the problem of fluid dripping. The effectiveness of suck-back valves are also limited since the long tubing often used can be compressed which can cause dripping despite use of the valves.

The available equipment and methods used today do not fully meet the high performance demands required by current processing solution dispense applications. There is a need for improved processing solution dispense apparatus and methods which reduce the occurrence of wafer defects and uneven application of a semiconductor processing coatings.

SUMMARY OF THE INVENTION

The invention herein provides methods and apparatus for dispensing semiconductor processing solutions with an array of individual fluid dispensers. It shall be understood that particular features of the described embodiments of the invention herein may be considered individually or in combination with other variations and aspects of the invention.

A preferable embodiment of the invention provides multi-syringe photoresist and fluid delivery systems. A wafer track module may include one or more dispense arms formed with grippers that are configured to grasp fluid syringes from a syringe tray. Individual syringes containing fixed amounts of prepared fluids may be picked-up by the gripper and dispense arm, and positioned over a wafer for release of its contents. The syringe may be returned and stored in a home position within its own holder thereafter. The holder may be fluidly connected to a liquid source to feed-in processing fluids such as resist solution into a reservoir or directly into the syringe itself. The multi-syringe configuration provided herein avoids the need for suck-back valves and pumps. Moreover, multiple fluids can be delivered onto a substrate with a reduced risk of cross-contamination which would otherwise be present with dispense heads having multiple nozzles located on the single head. The multi-syringe embodiments and the methods of their use disclosed herein provide a relatively simple and effective solution in dispensing a variety of processing fluids with reduced dripping.

Another aspect of the invention provides methods and apparatus for dispensing fluids within processing modules using dispense arms that are configured to grasp individual nozzles from an array of fluid lines. Each nozzle from the array may connected to a separate tube that is fluid communication with a variety of liquid sources. The tubes may be insulated and covered with a thermal heat exchange jacket to maintain the fluids therein at a selected temperature. The liquid sources may each include a syringe pump or series of individually controlled syringe pumps to feed fluids through the tubes to be dispensed through selected nozzles. The nozzle may be picked-up by a gripper installed on the dispense arm, positioned over a wafer to direct fluids passing therethrough following activation of the respective syringe pump, and then returned to a home position within the array of fluid lines.

Other goals and advantages of the invention will be further appreciated and understood when considered in conjunction with the following description and the accompanying drawings. While the following description may contain specific details describing particular embodiments of the invention, this should not be construed as limitations to the scope of the invention but rather as an exemplification of preferable embodiments. For each aspect of the invention, many variations are possible as suggested herein that are known to those of ordinary skill in the art. Many changes and modifications may be made within the scope of the invention without departing from the spirit thereof.

BRIEF DESCRIPTION OF THE DRAWINGS

The illustrations included within this specification describe advantages and features of the invention. It shall be understood that similar or like reference numerals and characters within the figures designate the same or like features of the invention. It should be further noted that the illustrations provided herein are not necessarily drawn to scale.

DETAILED DESCRIPTION OF THE INVENTION

Figure 1:
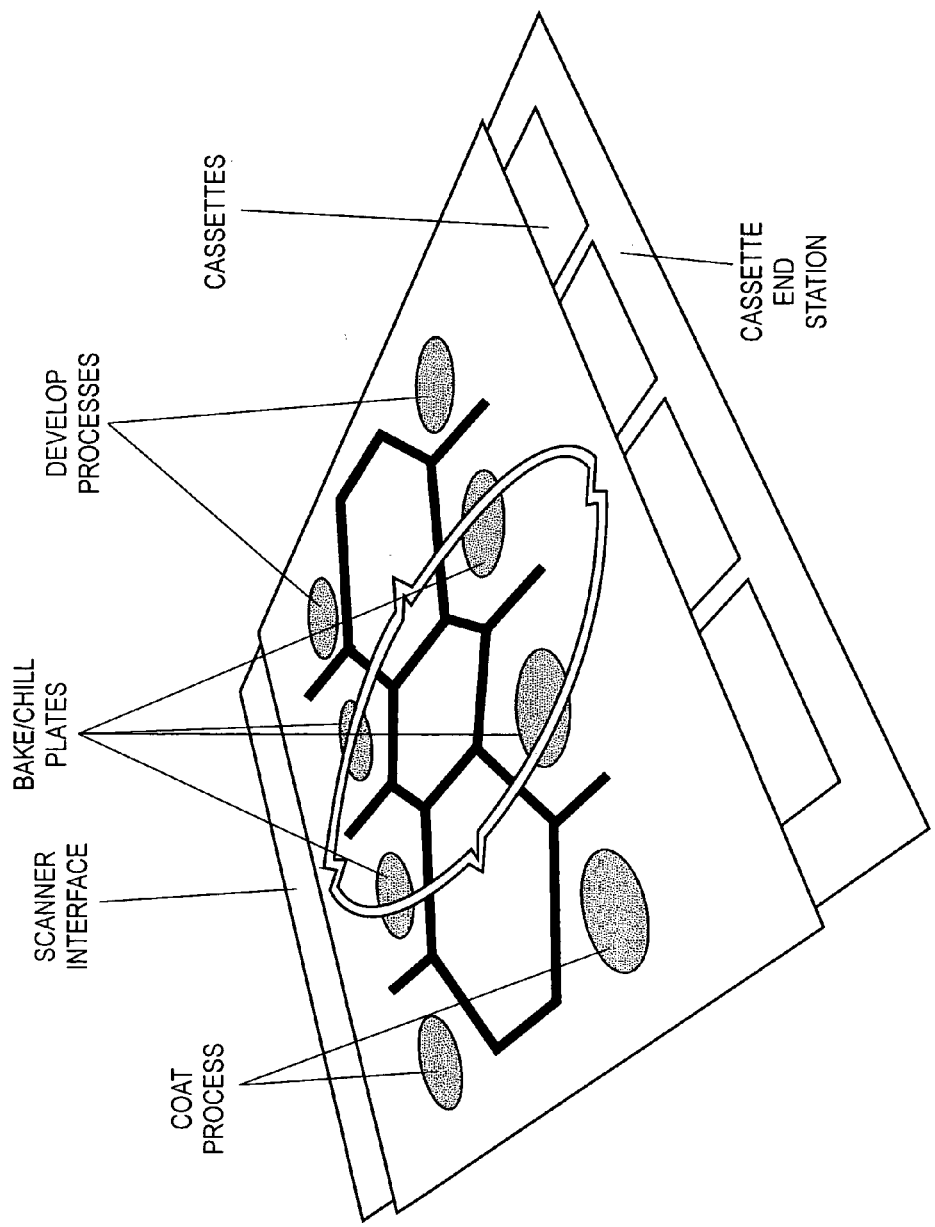
FIG. 1 is a simplified floor plan layout of a wafer track system that includes stacks of various processing modules used for semiconductor wafer manufacturing.

The invention herein may be applied to semiconductor processing equipment such as the wafer track system generally described in FIG. 1. The wafer track system may include basically three sections: a cassette end interface section, a scanner interface section, and a process section. The cassette end interface section includes apparatus to transfer wafers from cassettes in which they are stored to the track system and, conversely, from the track system back to cassettes following processing. The scanner interface section may be considered another transition area that accommodates equipment for transferring wafers between the track system and photolithographic apparatus. Meanwhile, the process section of a wafer track basically includes a number of wafer processing modules such as resist coating spin modules, bake/chill modules and resist developing spin modules. As shown in the system layout of FIG. 1, various process stacks within a wafer track may be arranged in an organized manner or optimal configuration to realize certain benefits and wafer handling efficiencies. For example, a number of process stations may be configured within the process section having stacks of processing modules for resist coat and develop processes. Stacks of thermal modules may also be included for heating and cooling wafers having heat exchange apparatus such as bake/chill plates. The process stations as shown in FIG. 1 may include a pair of photoresist coat sections or stacks of processing modules for applying the initial resist coating onto wafers, and a pair of developing sections with modules for developing a patterned resist-coated wafer. The wafers may be delivered and transported within the track system between process stations using a series of robotic arms or other wafer handling apparatus according to a desired program or set of instructions in accordance with a predetermined order of processing.

A semiconductor wafer treatment process involves a highly organized set of procedures. Wafers can be initially fed into the wafer track from one or more cassettes stored locally at a cassette end station. As shown in the floor plan of FIG. 1, a series of wafer cassettes can be arranged in a set of four distinct columns supported on a cassette-mounted table. A wafer carrying robot may gain access to a desired cassette in order to transfer wafers from and to selected process modules within the wafer track system in response to commands received from a controller (not shown). Before forming a photoresist film layer onto a wafer or substrate, the wafer may be first transferred to a priming module where its surface can be thermally or chemically treated to remove the presence of moisture and to assure a hydrophobic surface. The wafer may then be cooled with thermal devices such as a chill plate, and then conveyed to a coating unit where a photoresist polymer is distributed evenly onto the wafer surface. The photoresist-coated wafer may be subsequently transferred to a heating unit or bake plate in order to heat and convert the photoresist polymer into a stable film. Upon completion of the heating step, the processed wafer may be cooled and either conveyed to a cassette for storage, or as in many instances, transferred directly to adjoining stepper apparatus through a stepper or scanner interface. The photoresist coating or film on the wafer is then exposed to a circuit pattern by a applicable photolithographic techniques within the stepper apparatus. After exposure of the stable film, the wafer can be transferred back to the track system and heated in a bake module to set the circuit pattern onto the film. The wafer may be then cooled in a chill module, and transferred to a develop module. In the develop module, a solution is applied onto the film to develop a portion of the film, and then a rinse solution is applied thereafter onto the wafer in order to remove developer solution from the surface of the wafer. The wafer may be thermally treated in a bake module afterwards, cooled in a chill module, and then returned to a cassette for storage. The fluid dispensing apparatus and methods provided herein in accordance with the invention may be applied to many developing systems available today including those described herein.

Figure 2:
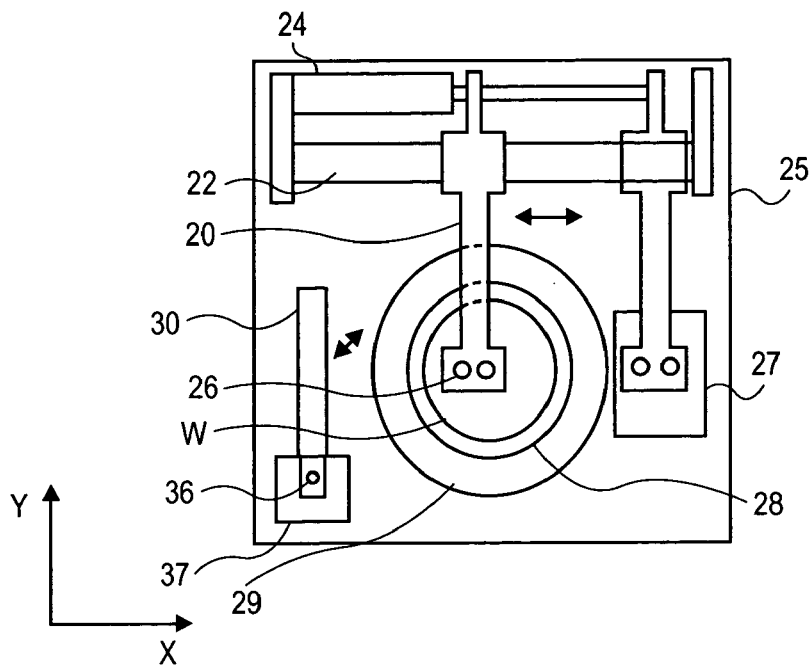
FIG. 2 is a top view illustration of a conventional linear and radial arm fluid dispense system within a processing module.
Figure 3:
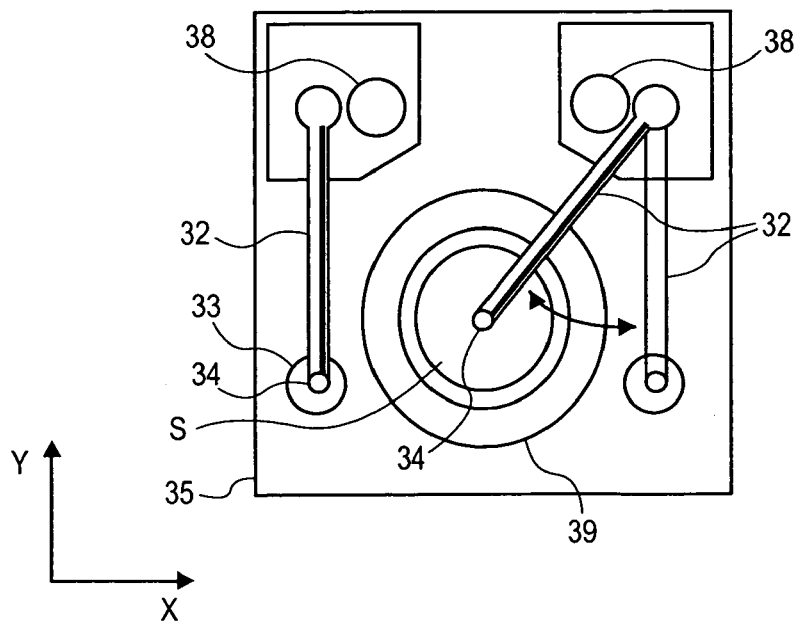
FIG. 3 illustrates a dual-dispense radial arm assembly within a track processing module.

As shown in FIGS. 2–3, resist coating modules within a wafer track system may include a variety of fluid dispense arms. The configuration shown in FIG. 2 illustrates a linear resist arm or arm that is capable of linear motion 20 that is movable along a defined X-axis direction. The linear arm 20 may be directed to slide along a set of rails 22 and driven by conventional electrically-actuated motors 24 or other drive mechanisms in order to move the arm back and forth along various positions within the module 25. The arm 20 may be also constructed to move in a relatively vertical direction in order to control the distance between the wafer W and the resist solution and/or fluid supply nozzle 26. The linear arm 20 may include two separate nozzles 26 for dispensing fluids such as photoresist and/or rinse solutions. A nozzle bath 27 may be also provided for preventing the nozzle 26 from drying when resting in a home position as shown. Furthermore, the linear arm 20 may be moved into a dispense position over a selected region above a wafer W mounted relatively flat onto a spin chuck 28 that is positioned within a cup or containment vessel 29. A variety of one or more fluids may be thus dispensed through the nozzle(s) 26 onto the wafer. Additionally, a radial fluid dispense arm 30 may be installed within the module 25 for dispensing various types of resist or processing solutions. Another bath 37 may be also selected for the additional nozzle 36 mounted on the radial arm 30 when placed in a home or stand-by position. The radial arm 30 may be pivotally mounted within the resist module 25 in proximity to the spin cup 29 so as to selectively sweep across and above the underlying wafer W horizontally along a defined X-Y plane at preselected intervals during resist coating processes such as those described herein. Alternatively, as shown in FIG. 3, a resist coating or processing module 35 may include a plurality of radial fluid dispense arms 32 each having a nozzle 34 mounted thereon for directing fluids to be dispensed onto an underlying substrate S such as a semiconductor wafer. Each radial arm 32 may be mounted on relatively opposite sides of the spin cup 39, and may have a dedicated nozzle bath 33 when positioned in a home or rest position. At selected time intervals during wafer processing, either or both arms 32 may swing out over the substrate S to dispense selected fluids thereon through nozzles 34 which may be connected to one or more fluid sources. The fluid dispense arms 32 may be driven and controlled by available driving means 38 as with other fluid dispense arm assemblies described herein.

A variety of coating processes may be carried out using conventional apparatus as shown in FIGS. 2 and 3. For example, during the resist coating of a wafer or substrate, the wafer may be first mounted on a spin chuck or platform. A resist coating solution supply nozzle, which may be ordinarily kept in a stand-by or home position relatively outside the immediate area of the wafer W, can sweep or scan above the wafer while supplying photoresist solution. The nozzle may direct solution over a certain wafer location for a preselected period of time or after a desired amount of fluid is released. The supply nozzle may be thereafter returned back to a stand-by or home position. After a predetermined amount of time has passed, the coating process is allowed to proceed to substantial completion. However with the type of process equipment used today, the supply nozzle can pass above the wafer again thus posing a substantial risk of resist solution drips falling onto the already coated wafer. The risk of forming drips is increased further since a relatively significant amount of solution under pressure is often deposited onto a wafer W quickly within a relatively short amount of time. When resist solution drips onto the wafer, numerous problems can result including wafer defects, line width defects, shape failure of the wafer and other undesired wafer characteristics. The invention described herein may be applied to such wafer track systems and resist coating modules to avoid or minimize the aforementioned limitations during wafer processing. It shall be further understood that the description of the invention herein with respect to forming a resist coating can be similarly applied to the dispense of developer and other processing solutions.

Figure 4:
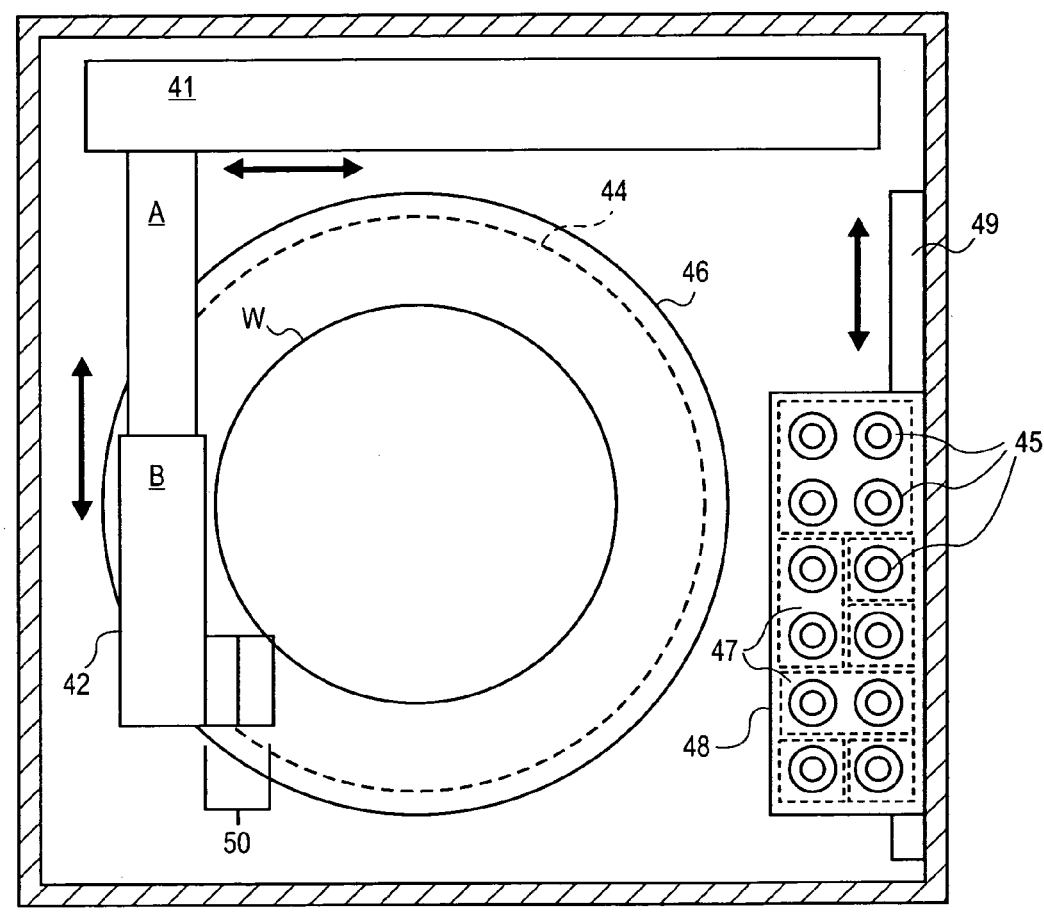
FIG. 4 is a top view of a process module that incorporates a fluid dispense arm with gripper and a multi-syringe tray provided in accordance with the invention.

FIG. 4. illustrates a process module 40 within a wafer track system that may be selected to apply coatings or films of various processing solutions such as photoresist. As shown in this top view of the process module 40 taken along a defined X-Y plane, a wafer W or substrate may be transported into the module by a robot arm 42 or transporter and placed onto a spin chuck 44. The spin chuck 44 may be positioned within a catch cup or bowl 46, and may be driven by a motor or rotary driving mechanism. The wafer W may be held in place on the spin chuck 44 with conventional vacuum suction equipment or other known alternatives. Furthermore, one or more linear dispense arms may be mounted within the module 40 to slidably move along an X-axis direction on a guide rail 41 mounted along a bottom or sidewall portion of the unit. The dispense arm 42 may be constructed with extendible segments A and B to provide a telescopic arm that extends back and forth along a Y-axis direction as illustrated. For either a radial or linear dispense arm design, certain portions A and B of the arm 42 may extend or contract as desired to position a distally mounted syringe gripper 50 or holder over a substrate or other desired location in accordance with this aspect of the invention. It shall be understood that the syringe grippers herein may be mounted onto other types of dispense arms within the module including pivotable radial arms such as those described in U.S. patent application Ser. No. 10/320,994, filed on Dec. 16, 2002, U.S. Pat. No. 6,770,424, which is incorporated by reference herein in its entirety.

A tray of fluid syringes 48 may be positioned within the process module 40 as illustrated in FIG. 4. The fluid syringes 45 may contain any variety of desired processing fluids such as resist solution(s) to be deposited on a wafer or substrate. Each syringe 45 may be housed within individual compartments 47 formed in the tray 48 or grouped together as desired to dispense similar types of fluid. In addition, the tray 48 or collection of syringes may be slidably mounted onto a tray track 49 to the sidewall or other portion of the module 40. The mobility of the syringe from the tray 48 is selected, the dispense arm 42 may move toward the tray so that the gripper 50 mounted thereon can be aligned with the desired syringe. In this embodiment of the invention, there are no processing fluid tubing that may impede interaction between the gripper 50 and desired syringes. Either the tray 48 can be fixed in a stationary position or otherwise move so as to assist in alignment of the gripper 50 with the selected syringe. The dispense arm 42 and gripper 50 may grasp the desired syringe from the tray 48 and position the syringe over a desired location above a rotating wafer to form a spin-coating. At the desired location and time, the gripper 50 may actuate the syringe to release the contents therein onto the underlying wafer. By releasing the entire predetermined amount of fluid in the syringe, the risk of dripping is further reduced. The following dispense of the syringe contents, the arm 42 may return the syringe back to an appropriate location or home position within the tray 48. The preceding steps may be repeated as desired so that additional syringes from tray 48 may be selected and similarly dispensed onto the wafer W or substrate.

The adjustable multi-fluid dispense arrays provided herein may include a plurality of syringes for depositing resist solution(s) and other types of processing fluids used in wafer track modules. With either a robotic dispense arm having a fixed or variable length, the tray containing the array of fluid dispense devices may be positioned in closer proximity to the robotic arm. This may reduce the workload required from the dispense arm alone and save time. A variety of known controllers (not shown) may coordinate movement between the arm and the tray so that minimal moves are required by either the arm and/or the fluid dispense tray. The shared workload placed on the dispense arm and tray may in turn provide some time-savings by reducing movement by robotic dispense arm only. In the event the a dispense arm has a limited range of movement within the module, which may be formed with various dimensions such as an approximately two-foot by two-foot layout, the syringe tray may also compensate for such limitations and hold a greater number of syringes that are accessible to the dispense arm gripper. The availability of numerous individual syringes simplifies construction of the dispense arm in that no fluid lines or tubes are needed to run through the arm. Accordingly, the number of different fluids to be dispensed is not limited to the number of fluid lines that may be carried or contained within the confines of the fluid dispense arm.

Figure 5:
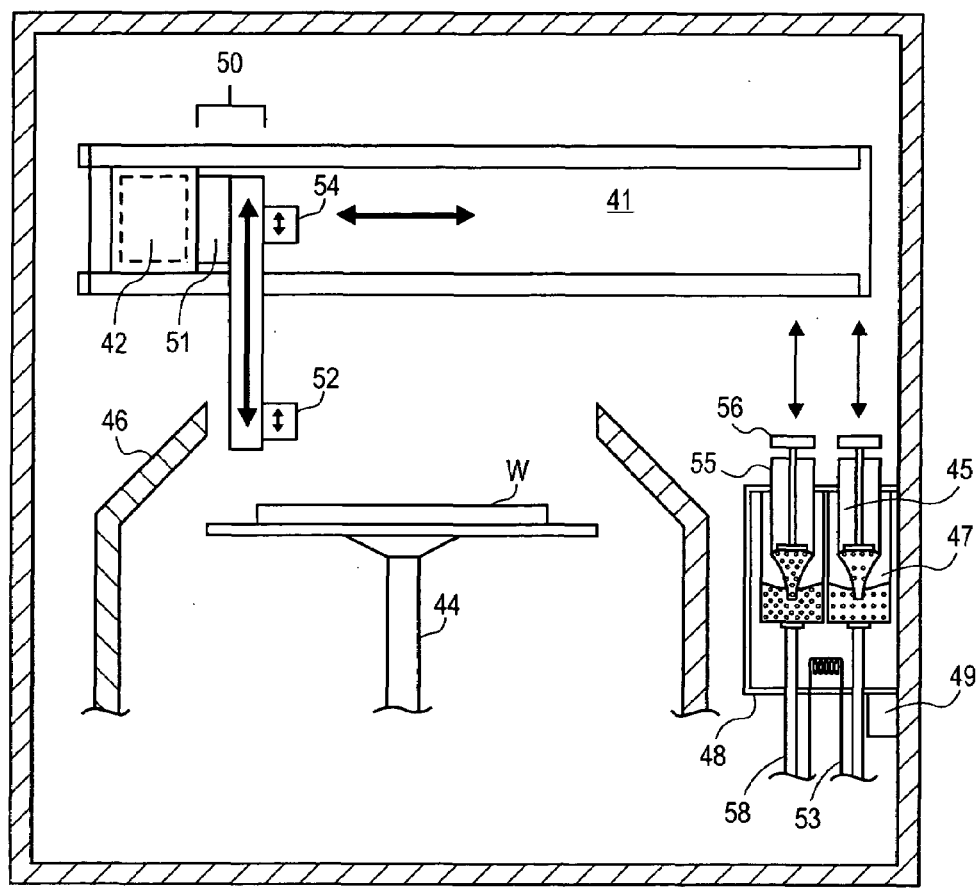
FIG. 5 is a side view illustration of a linear fluid dispense arm and gripper for selecting one or more syringes from a tray located within the process module shown in FIG. 4.

FIG. 5 provides another illustration of the fluid dispense arm and gripper shown in FIG. 4 which is taken along an X-Z plane of the wafer track module 40. The fluid dispense arm 42 may be positioned and slidably move along the track 41 mounted on the sidewall portion of the module 40. The gripper 50 mounted on the dispense arm 42 may include a syringe holder 52 that can grab or secure the main body portion 55 of a syringe. In addition, the gripper 50 may be formed with a plunger holder 54 to secure the plunger portion 56 of the syringe. The plunger holder 54 may move itself or can be mounted to a movable actuating member 51 that selectively lifts and lowers the syringe plunger 54 in an up-and-down direction as directed to load and release fluids to be dispensed. The activation of the plunger holder 54 and the general movement of the dispense arm 42 can be directed by one or more controllers as with other motor driven assemblies in process module described herein. The dispense arm 42 and gripper 50 may be kept in an initial ready stand-by position within module 40 adjacent to the catch cup 46. The dispense arm 42 may be directed upon command to retrieve a selected syringe from the tray 48. The selected syringe may be stored in a relatively upright position within a portion of the tray 48 over a respective fluid reservoir 47 which may be shared with other syringes. A flexible flap covering may cover the fluid reservoir 47 to prevent entry of foreign objects and to readily allow a syringe to be removed and replaced while standing in an upright position. The fluid reservoir 47 may be formed within the tray 48 to hold a selected amount of processing fluid such as resist. The reservoir 47 may be fluidly connected to a feed line 58 which leads to an external fluid source. Additionally, the tray 48 may include a heat exchanger 53 located in relatively close proximity to the fluid reservoir 47 and/or feed line 58. The heat exchanger can maintain the fluid to be dispensed by the syringe at a desired temperature. A variety of known heat exchange devices such as Peltier elements and thermoresistors can be selected to obtain a desired fluid temperature. Rather than circulating heat exchange fluid around relatively long feed lines with conventional nozzle and hose assemblies, a selected volume of fluid can be cooled or heated as desired thus providing highly efficient heat exchange with a smaller volume of fluid as required. The syringe tray 48 may include an individual heat exchanger for each individual syringe reservoirs to maintain various fluids at different temperatures. Other embodiments of the invention provided herein may direct fluids directly into the syringes stored in the tray without intermediate storage of fluid within a reservoir.

Figure 6A:
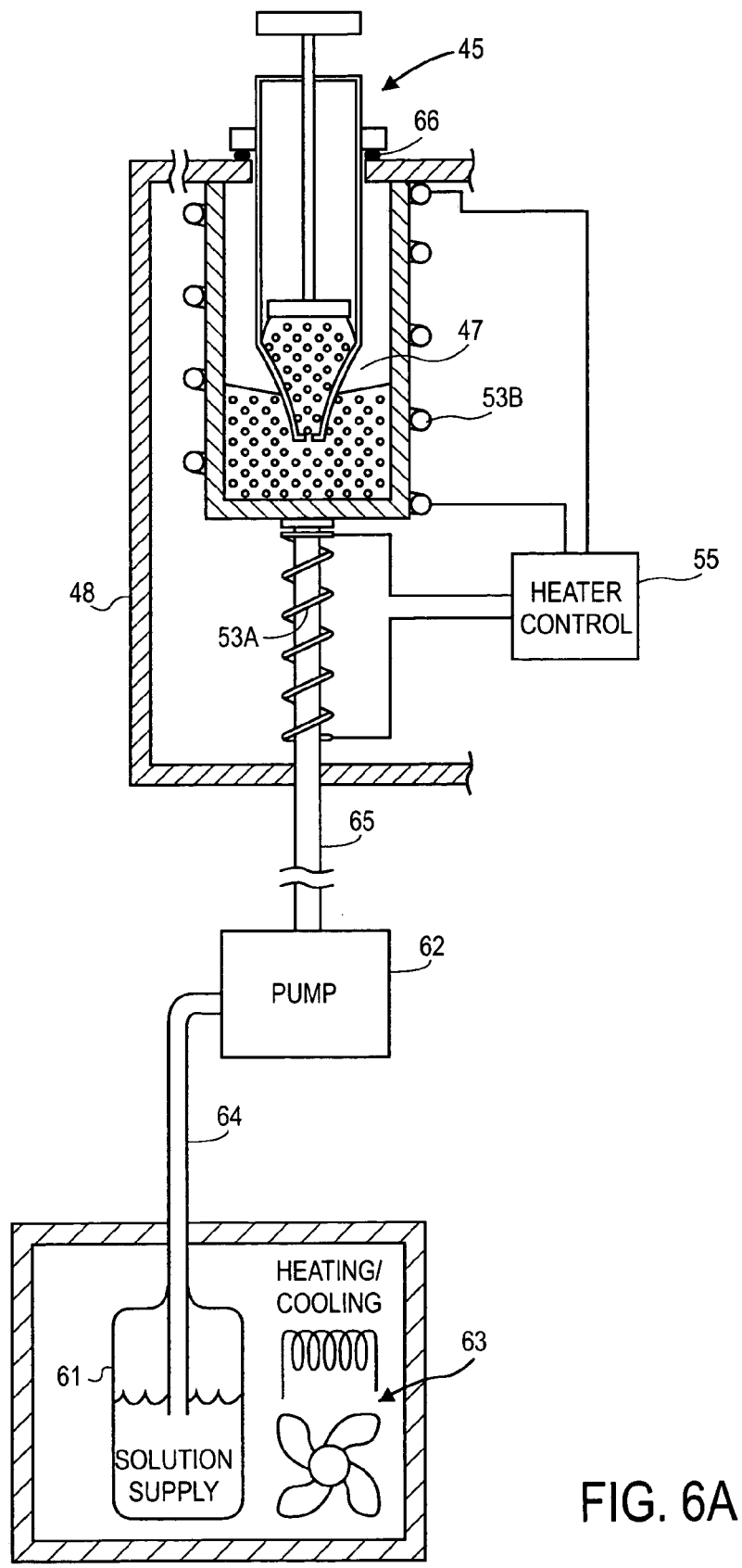
FIGS. 6A–B are close-up views of fluid dispense syringe nozzles that are fluidly connected to liquid source.
Figure 6B:
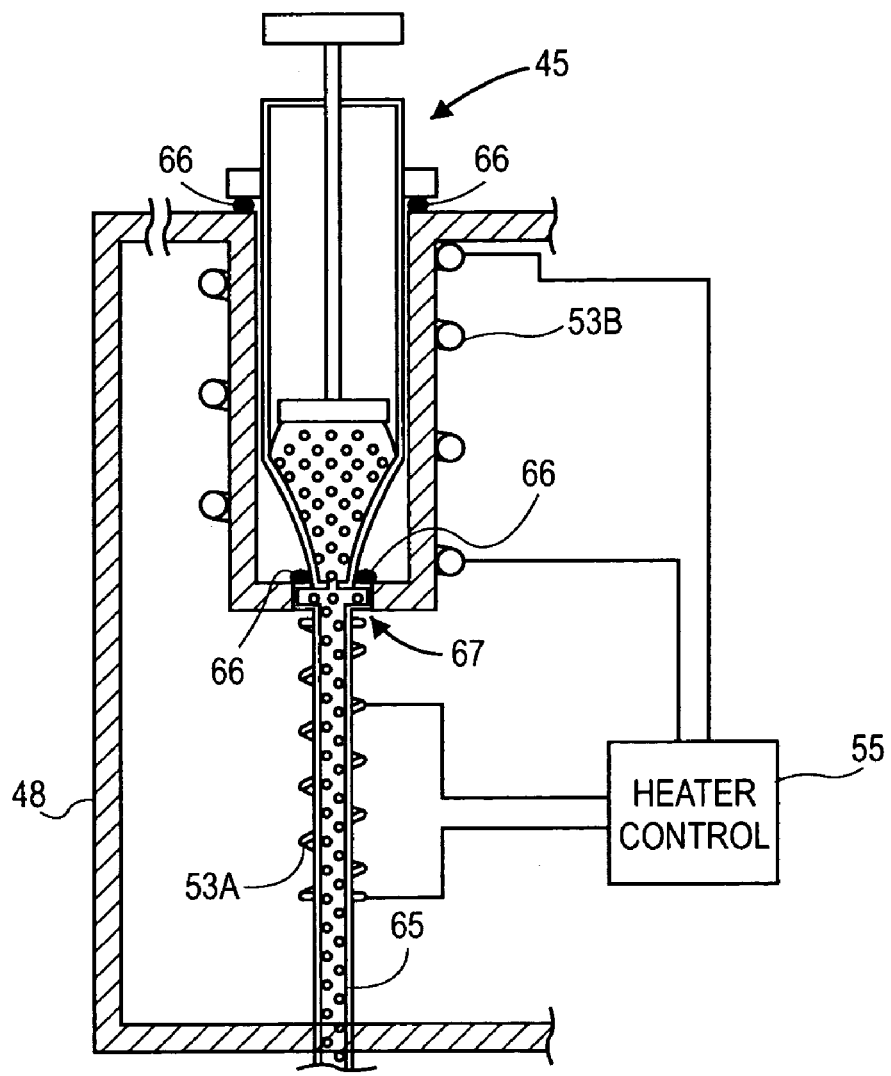

As shown in FIG. 6A, a fluid dispense syringe 45 may be fluidly connected to a liquid source 61. The liquid source 61 may also include a heat exchanger 63 to maintain a stored solution at a desired temperature. The liquid source 61 may be connected to a pump 62 which draws fluid through a source line 64. The pump 62 may operate independently or in concert with other pumps which may be selected to feed fluids into the syringe tray 48 from external fluid sources. The fluid drawn by the pump 62 may be directed through a syringe line 65 to one or more fluid reservoirs 47 formed in the syringe tray 48. Alternatively, no pump is needed when fluid is fed into the reservoir 47 from above with gravity assisted designs or manually poured therein. Multiple syringes may share a common reservoir, or each may receive the same type of fluid to be dispensed. In another embodiment of the invention as shown in FIG. 6B, no reservoirs are needed. Fluids from the pump 62 may be sent directly to syringe 45. An opening 67 in the tray 48 may allow fluids to be pumped into the syringe 45 through a syringe line 65. A series of valves or seals 66 may be selected to form a fluid tight seal with the syringe 45. In yet another embodiment of the invention, disposable single-use syringes may be sealed and stored in the tray 48 wherein the syringes already contain a fixed amount of photoresist or processing solution to be dispensed and may be discarded after use. The processing solution 61 may be stored until needed and kept at a desired temperature by its respective heat exchanger 63. Depending upon the desired temperature control for dispensed fluids, either or both of the illustrated syringe tray heat exchangers 53A and 53B may be selected and controlled by a temperature control 55 for certain applications. It shall be understood that a plurality of processing solutions may be dispensed which may be connected to one or more combinations of fluid pumps and feed lines leading to the syringe tray.

Figure 7:
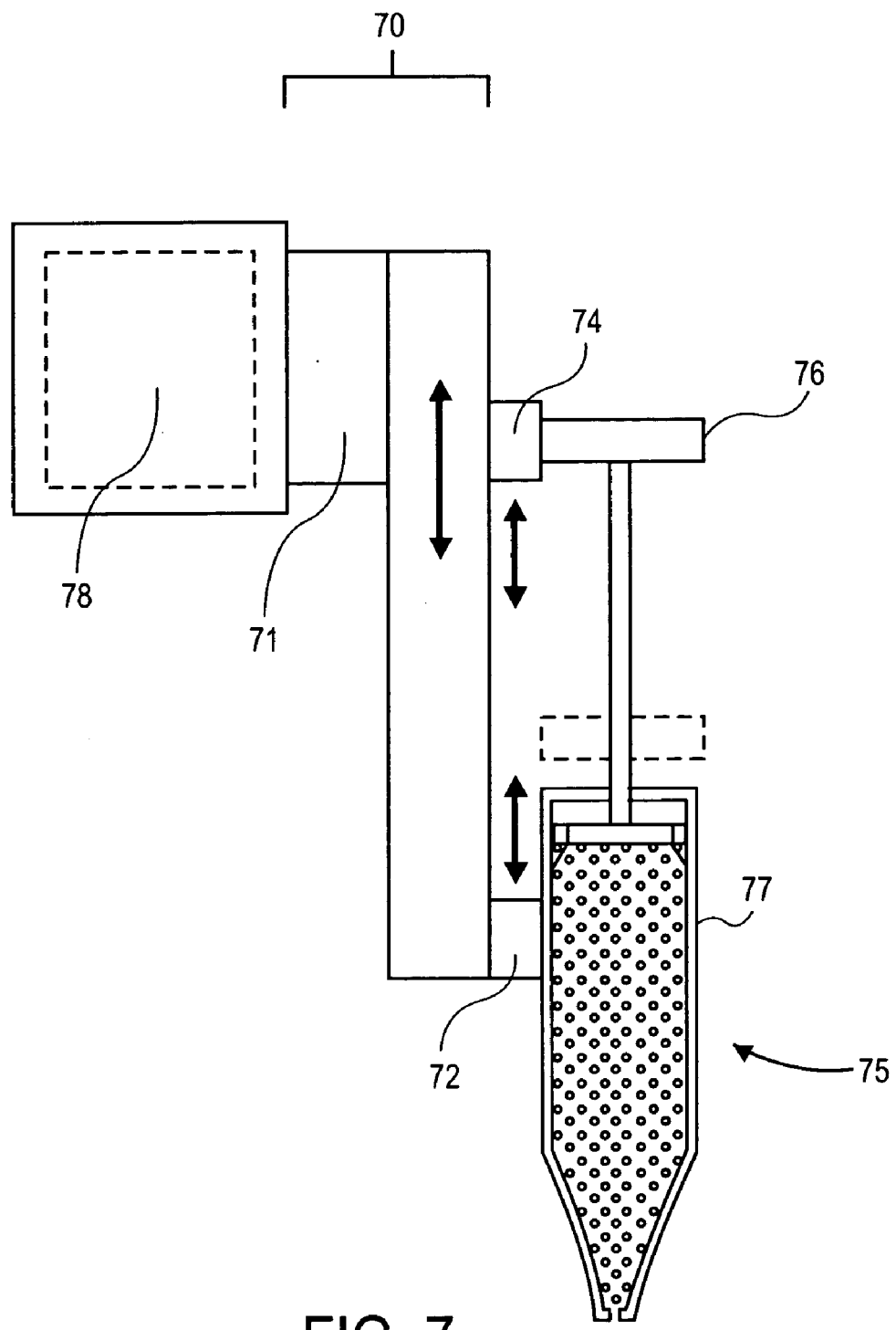
FIG. 7 is an enlarged side view of the dispense arm gripper engaging the plunger and body portions of a fluid dispense syringe.

The activation of a dispense arm gripper is illustrated in FIG. 7 whereby processing solutions are loaded or unloaded into a syringe. The dispense arm gripper 70 may engage both the plunger portion 76 and body portion 77 of a syringe 75. The syringe holder portion 72 of the gripper 70 may engage the body portion 77 of the selected syringe, and the plunger holder portion 74 may similarly engage the syringe plunger 76 which may be kept in either a loaded or unloaded position (indicated by dashed lines). In a loaded position, the plunger 75 may be already retracted relatively upward and contain a preselected amount of fluid within the syringe 75. Meanwhile, in an unloaded position, the syringe 75 does not yet contain the desired amount of fluid to be dispensed or has already dispensed the fluid. When loading the desired fluid, the syringe holder 72 may securely hold onto the syringe 75 while the plunger holder 74 can lift or retract the plunger 76 to draw fluid into the syringe from a fluid reservoir. The plunger holder 74 may include an actuating member 71 connected to the dispense arm 78 that moves in and up-and-down manner to load and unload the syringe 75. It shall be understood that a variety of syringes and pipettes are available today including those utilized in the biotechnology industry. Depending on actuating mechanism for each of these fluid dispensing devices, a dispense arm gripper may be configured to selectively grasp and actuate each in accordance with the invention. Furthermore, the syringes selected herein may be disposable single-use fluid delivery devices that are relatively inexpensive and can be discarded after use as opposed to being loaded and reused.

Another aspect of the invention provides various methods of resist coating a semiconductor wafer substantially without drips with the apparatus described herein. For example, a resist coating module may be provided with a dispense arm formed with a distally mounted gripper for grasping at least one fluid syringe. The dispense arm may be instructed to select and grasp a desired syringe from a tray within the module. Afterwards the dispense arm and syringe may be positioned over a desired location within the module such as over a catch cup that contains a spinning wafer mounted on a spin chuck. The gripper may then unload or actuate the syringe by lowering a plunger portion of the syringe to dispense the contents of the syringe onto the wafer to form a resist coating. The dispense arm may be then instructed to return the syringe to a compartment within the tray. The compartment may contain resist solution so that the syringe can be lowered so as to be able to draw in solution. The dispense arm gripper may be instructed to load or retract the plunger so that the syringe can immediately dispense fluids again or kept in a ready stand-by loaded position. It shall be understood that the syringes described herein can be formed in various sizes and contain fluid volumes ranging from approximately 0.5–5.0 cc or greater.

Figure 8:
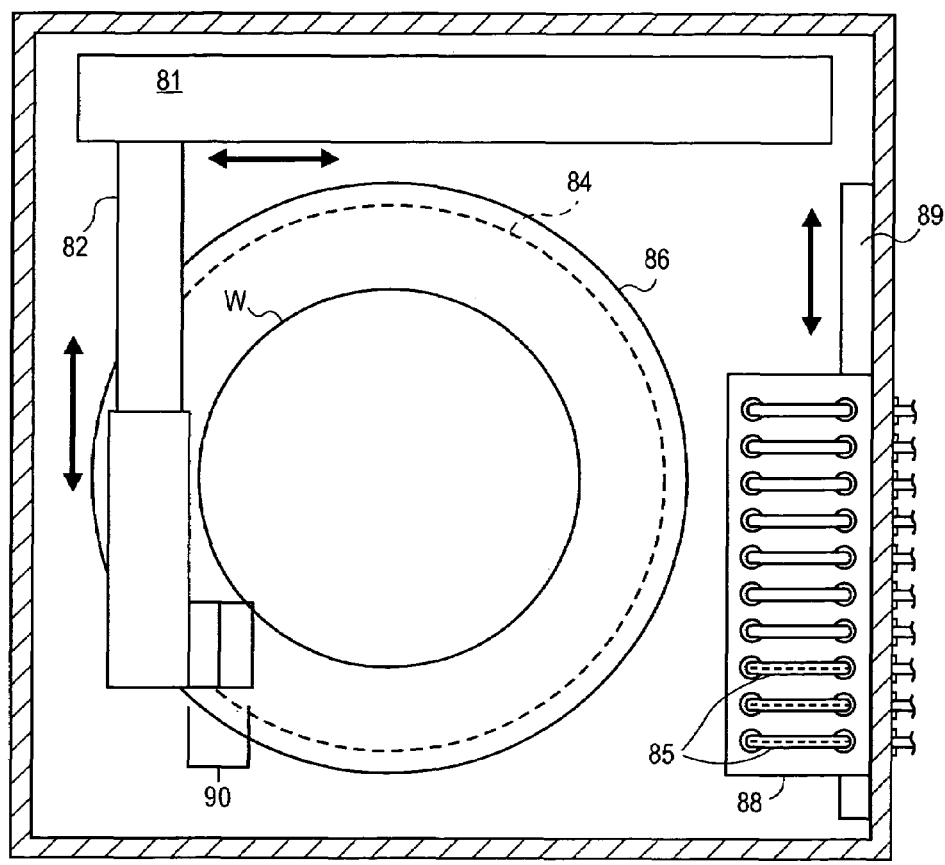
FIGS. 8–11 are various illustrations describing yet another aspect of the invention herein that provides fluid dispense systems for depositing a wide array of processing solutions from an array of fluid dispense lines and nozzles.
Figure 8:
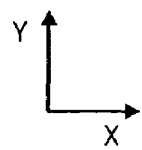
Figure 9:
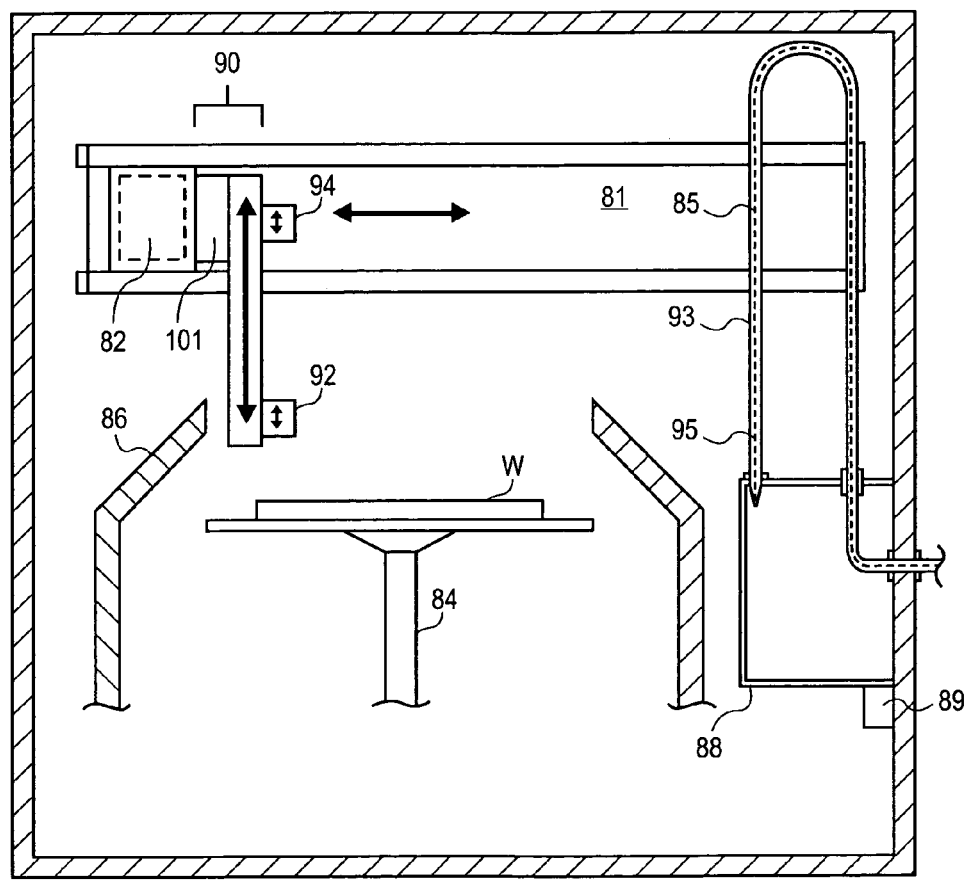
Figure 10:
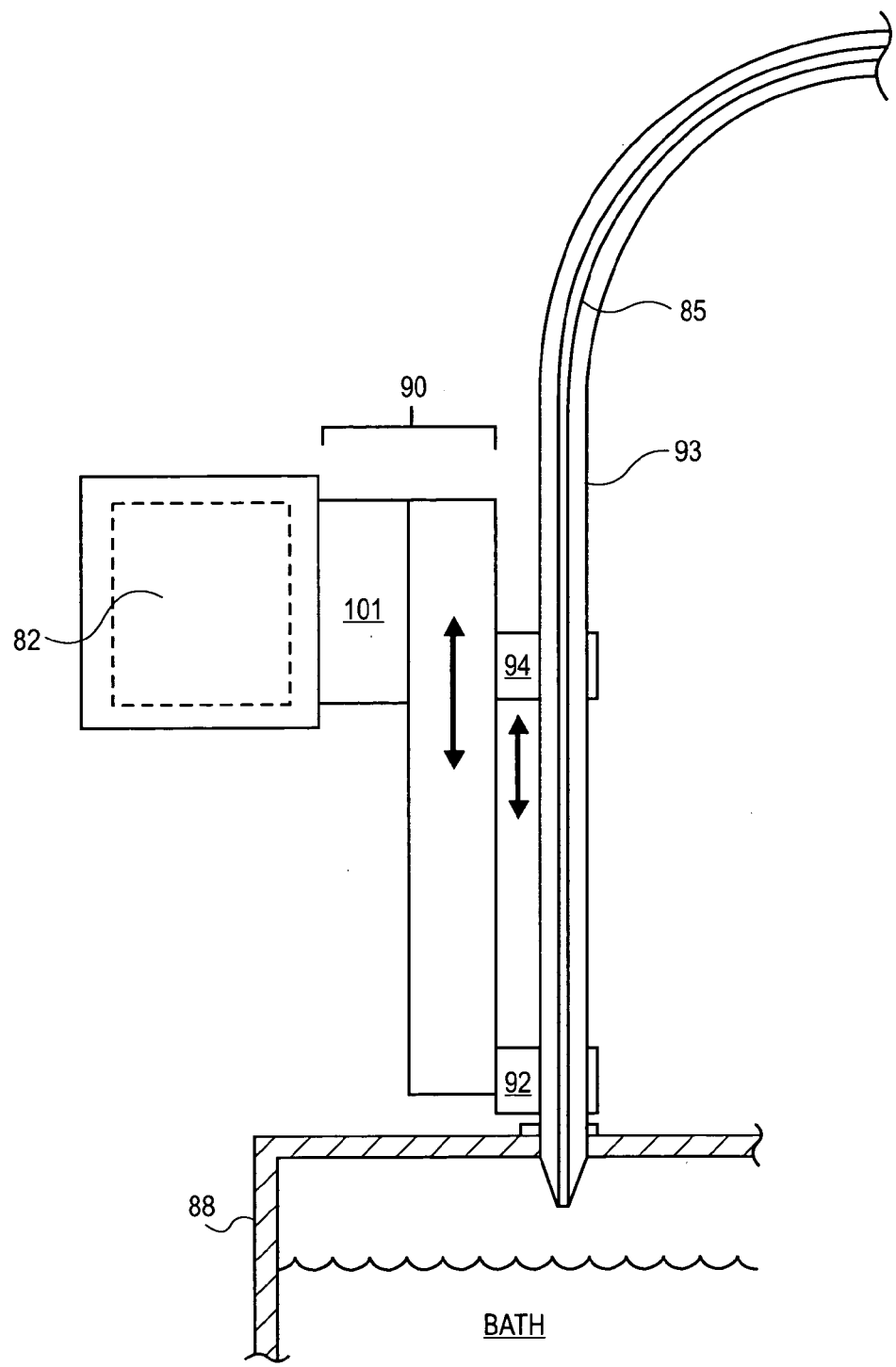
Figure 11:
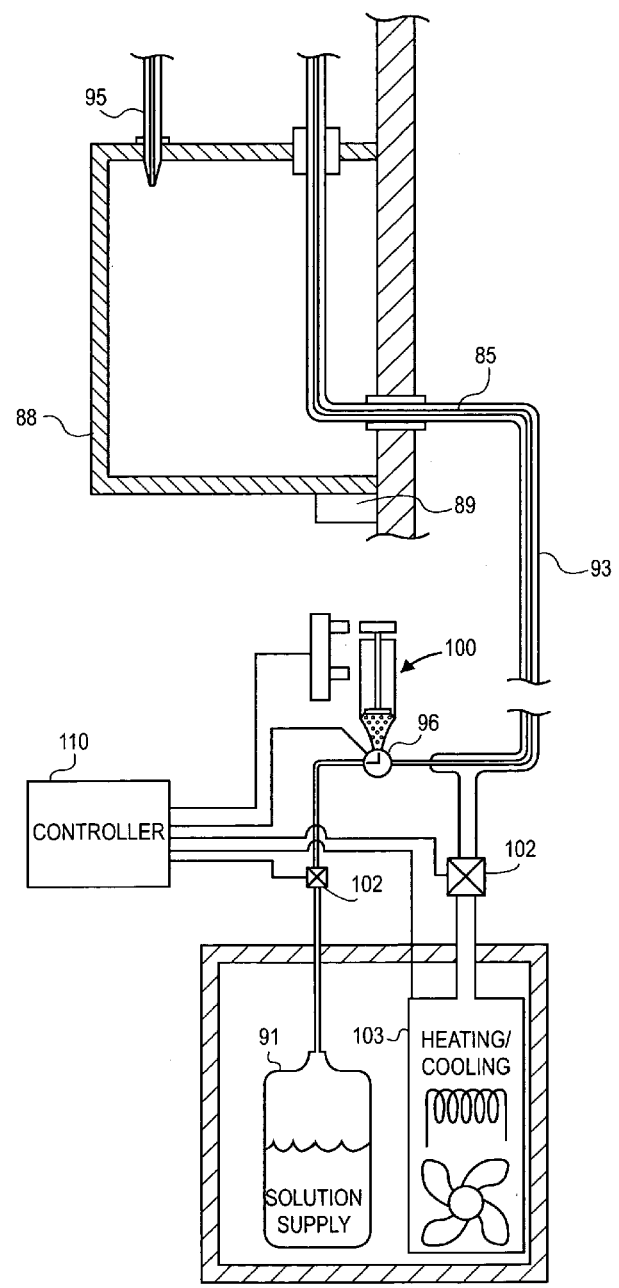

FIGS. 8–11 describes yet another embodiment of the invention that provides fluid dispense systems using an array of individual fluid dispense lines and nozzles. By offering an array of tray-mounted fluid dispense lines 85 nearby, a dispense arm 82 may individually select each fluid line as needed rather than containing or transporting all fluid lines each time. The number of fluid lines 85 are typically formed with a three to six-foot length, and different types of processing solutions to be dispensed, are thus not limited by physical parameters of the dispense arm 82. As shown in FIGS. 8–9, a dispense arm 82 may be constructed with one or more grippers 90 such as those described elsewhere herein. A series of one or controllers may position the dispense arm 82 along various regions within the module 80 relative to a spin cup 86 and chuck 84 mounted wafer W or substrate. The dispense arm gripper 90 may align with a selected nozzle 95 stored in a bath on a tray 88 for dispense of a desired processing solution. The tray 88 may be slidably mounted on a track 89. The gripper 90 may be formed with one or more holders 92 and 94 to grasp the selected nozzle 95 if desired as shown in FIG. 10. Another actuating member 101 may be provided to assist in the up-and-down movement of the gripper 90. Each nozzle 95 may be connected to a feed line 85 housed within individual tubes or thermal jackets 93 wherein each feed line may be connected to an external fluid source 91 and commercially available syringe pumps 100 (Cavro, Inc., San Jose, Calif.) as illustrated in FIG. 11. A series or bank of fluid syringe pumps 100, including their respective separate valve mechanisms 96, can be independently actuated or regulated by a central controller 110 to dispense fluids. Alternatively, passive valves may be selected to direct fluid into and out of the syringe 100. Each tube 93 may contain circulating heat exchange mediums or elements 103 to maintain the feed line 85 and fluid contained therein at a desired temperature or range of temperatures. The central controller 110 can also regulate the temperature and also the flow of fluids and cooling and heating medium with a variety of valves 102. A combination of one or more syringe pumps 100 may be installed along various portions of the fluid lines 85 as is known in the field to even further reduce the risk of dripping. The single-tube fluid dispensers provided herein can offer highly-controlled fluid release with individual pumps for each nozzle and tube assembly with a reduced risk of cross-contamination.

A variety of fluid dispense arms may be selected herein to move grippers within different locations in the process module. Many wafer track process modules are provided with desired laminar airflow to carry out extremely exacting procedures in a fluidly stable environment. Conventional fluid dispense arms in wafer track modules generally have a linear hard-edged design and are formed with a simple rectangular design, which are hollow to accommodate tubing that feeds into a nozzle mounted on the distal tip of the arm. Dispense arms with a upside down "U"-shaped cross-section are commonly used whereby tubing is tucked underneath the arm and situated within the hollow portion of the arm hidden from view substantially. The non-aerodynamic edges of a dispense arm can however create turbulent airflow close to a spinning substrate. When the arm is swept close to its surface, the shape of this conventional arm disrupts airflow adversely affecting even or uniform coating thickness of materials such as photoresist. Considering the speed at which certain components with a track module are moving, and the rates at which fluids are dispensed within the enclosed environment, it is preferable to maintain substantially laminar airflow within the module.

Figure 12:
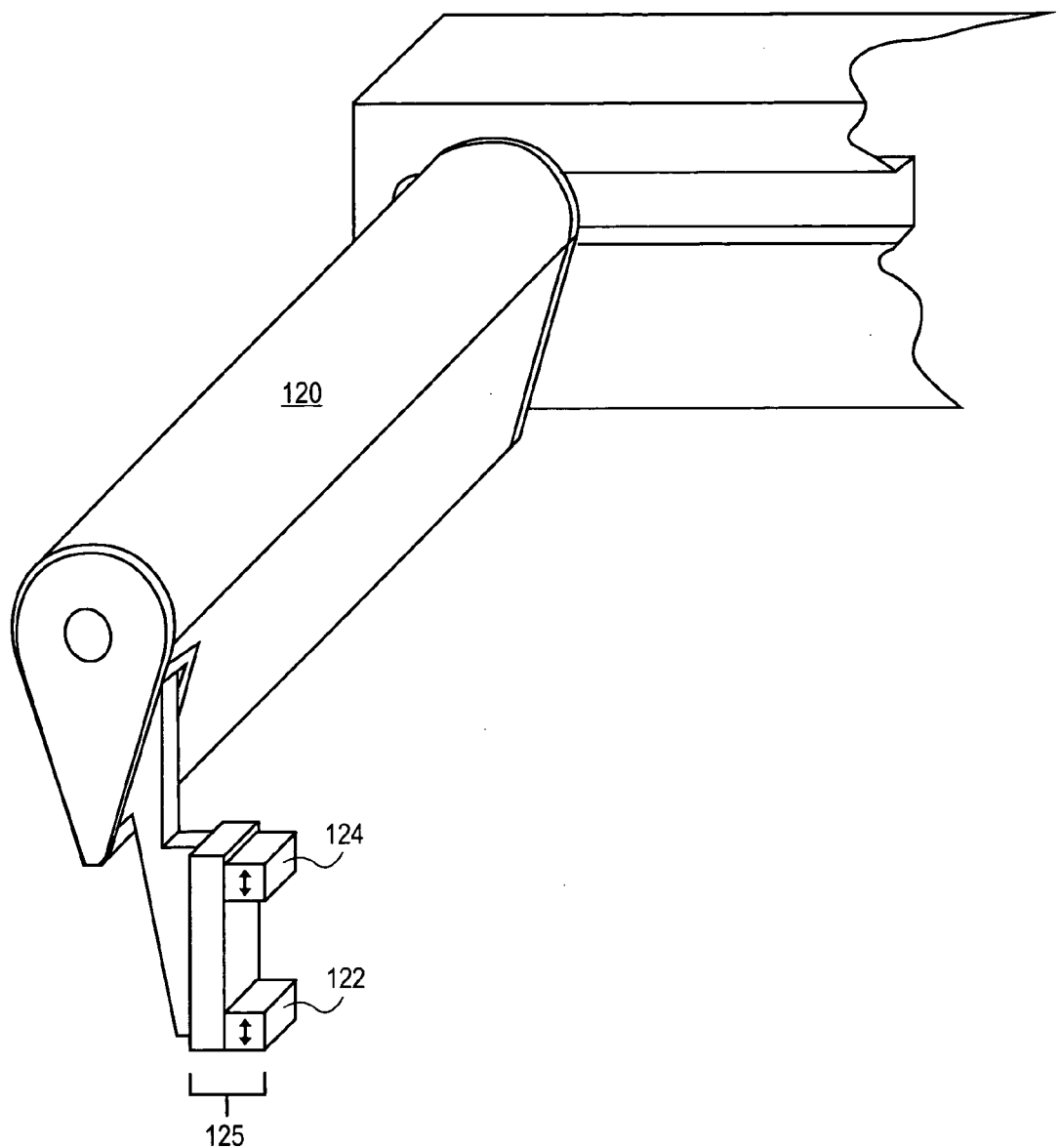
FIG. 12 illustrates an aerodynamic dispense arm that may be selected for use with the methods and apparatus described herein.

In accordance with another aspect of the invention, the fluid dispense arms herein may be configured as an aerodynamic foil as shown in FIG. 12. The aerodynamically constructed fluid dispense arm may be used in a variety of wafer track processing modules such as the resist coating and developer units. The dispense arm 120 may be tapered and include a relatively larger curved side upper portion opposite a relatively smaller curved side lower portion. As with other gripper assemblies 125 herein, a pair of holders 122 and 124 may be mounted on a relatively distal end portion of the dispense arm 120. As with other air foil designs generally, the fluid dispense arms herein can be formed with smooth surfaces so as not to adversely affect laminar airflow intended within the module. For certain dispense arms where tubing is not run through a hollow cavity within the dispense arm, including those selected for the multi-fluid dispense syringe or nozzle/tube arrays described herein, the region underneath the arm facing a spinning surface does not trap air or otherwise disrupt the desired smooth airflow desired in the module. Accordingly, the simplified dispense arm designs provided herein offer smooth fluid dispensing results that can provide a more even distribution of fluid and less likelihood of wafer defects.

Figure 13A:
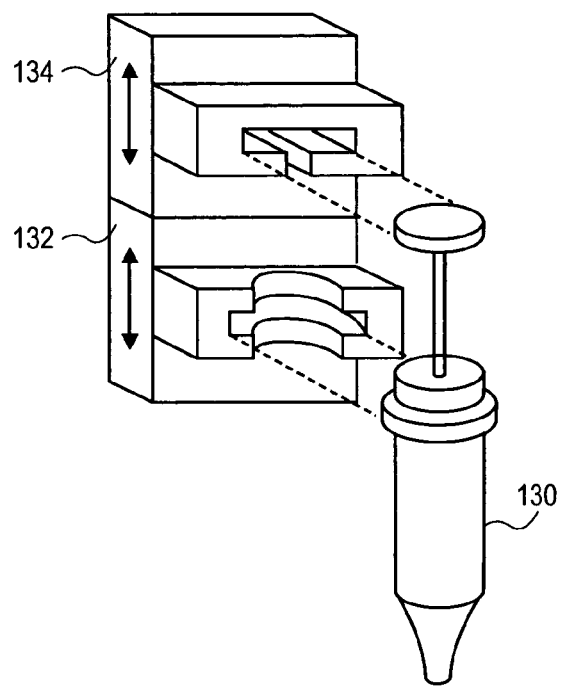
FIGS. 13A–E depict various grippers which may be selected for various fluid dispense arms provided herein in accordance with various aspects of the invention.
Figure 13B:
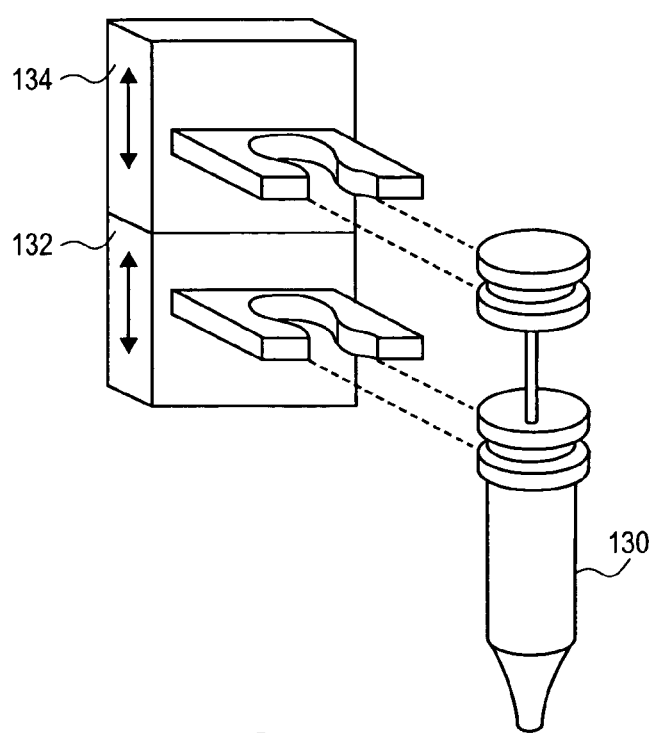
Figure 13E:
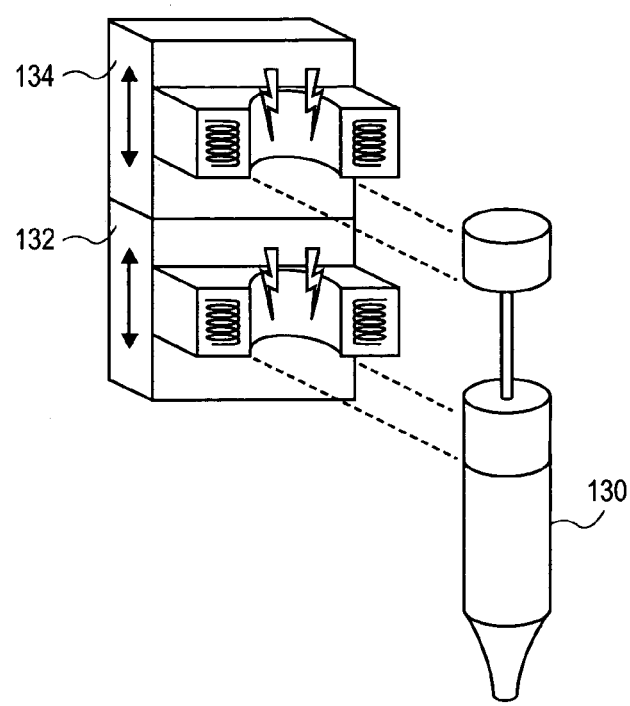
Figure 13C:
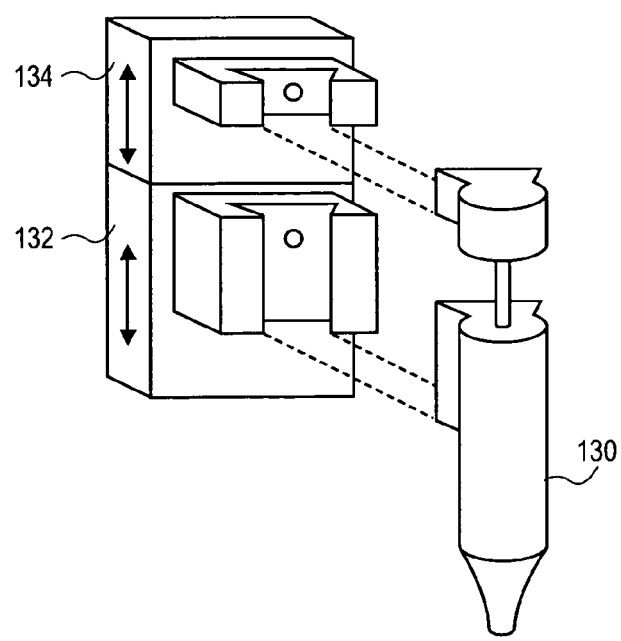
Figure 13D:
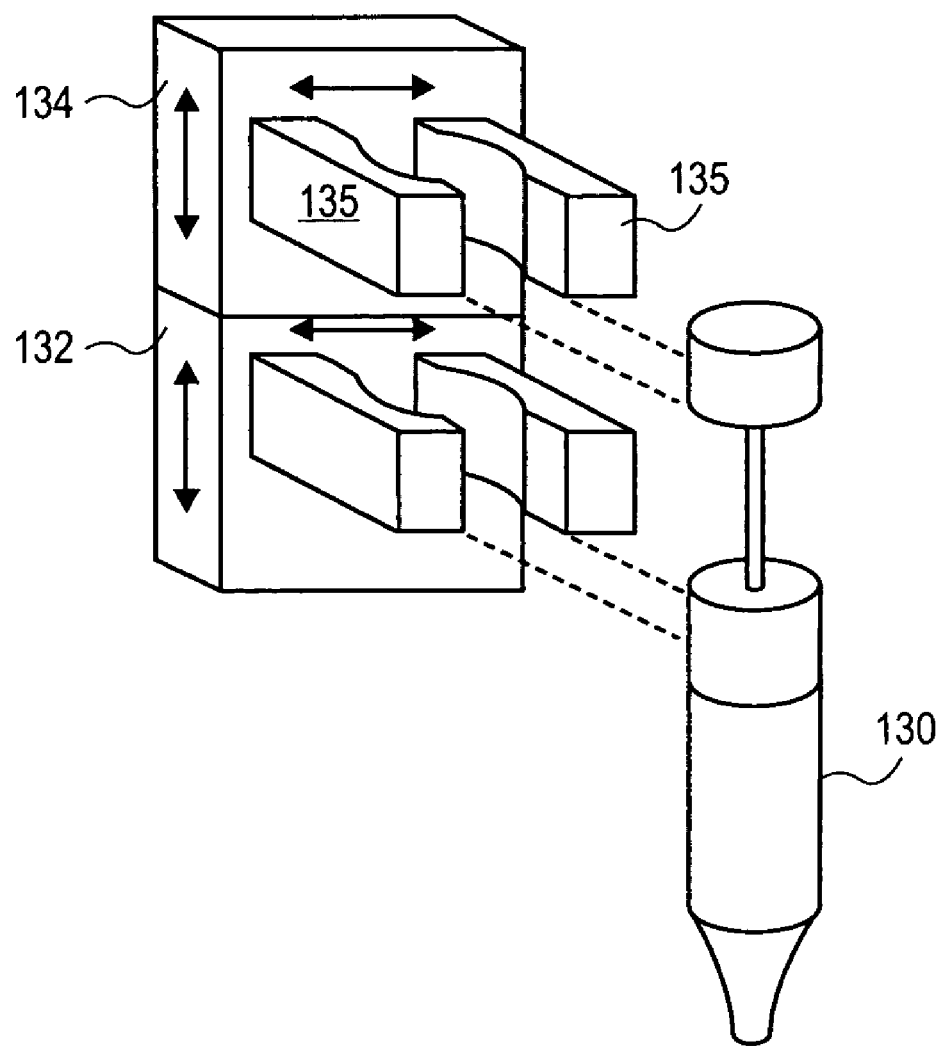

The dispense arms provided herein may be configured with a wide variety of grippers such as those shown in FIGS. 13A–E. It shall be understood that the term "gripper" as it is used herein shall include both active and passive gripping mechanisms. A variety of mechanically and magnetically activated grasping assemblies are provided herein to perform active gripping functions. For example, a gripper may include one or more holder portions to grasp dispense nozzles or syringes from a processing fluid or solution tray. The gripper may include two opposing members 132 and 134 that can be drawn closer or further apart to grasp or release a syringe 130 or nozzle, respectively, as shown in FIGS. 13A–C. A series of grooves and slots may be formed on the portions of a gripper holder and the plunger or body portions of a syringe 130 herein which slidably engage each other in a complementary manner. Alternatively, as shown in FIG. 13D, a plurality of alternating opposing members or finger portions 135 may be mechanically actuated to open and close. A gripper may also include a magnetically activated plate as shown in FIG. 13E to engage and disengage another plate on a syringe or nozzle. Other embodiments of the invention may also include passive gripping apparatus such as spring activated members that selectively hold and release objects upon application of sufficient force.

While the invention has been described with reference to the aforementioned specification, the descriptions and illustrations of the preferable embodiments herein are not meant to be construed in a limiting sense. It shall be understood that all aspects of the invention are not limited to the specific depictions, configurations or relative proportions set forth herein which depend upon a variety of conditions and variables. Various modifications in form and detail of the embodiments of the invention, as well as other variations of the invention, will be apparent to a person skilled in the art upon reference to the present disclosure. It is therefore contemplated that the appended claims shall also cover any such modifications, variations or equivalents.

What is claimed is:

1. A multi-syringe fluid dispensing system for semiconductor substrate processing comprising:
   a wafer track coating module containing a spin chuck that is positioned within a catch cup;
   a solution tray located within the wafer track coating module for holding a plurality of fluid syringes containing semiconductor substrate processing solutions; and
   a dispense arm and gripper assembly for gripping and positioning a fluid syringe within the wafer track coating module, the gripper including a plunger holder and a syringe body holder for engaging a selected syringe from the solution tray.

2. The multi-syringe fluid dispensing system as recited in claim 1, wherein the selected syringe from the solution tray includes complementary portions that removably engage the plunger holder and the syringe body holder.

3. An apparatus for dispensing a plurality of semiconductor substrate processing solutions comprising:
   an array of fluid dispensers mounted on a tray within a processing module, wherein each fluid dispenser includes a nozzle portion formed at a relatively distal region of the fluid dispenser, a fluid line running along a length of the fluid dispenser leading to the nozzle portion, and a thermal jacket surrounding each fluid line for circulating a heat transfer medium and individually controlling the temperature of fluid within each fluid line;
   a dispense arm for supporting a mounted gripper that is configured to grip a selected nozzle portion of a selected fluid dispenser, and wherein the dispense arm can direct the selected nozzle portion to a predetermined location within the processing module;
   a fluid syringe pump assembly fluidly connected to a photoresist solution source and the fluid line of the selected fluid dispenser; and
   a controller for controlling the fluid syringe pump assembly and the dispense of fluid from the photoresist solution source through the selected nozzle portion of the selected fluid dispenser.

4. The apparatus of claim 3, wherein the tray is slidably connected to the processing module.

5. The apparatus of claim 3, further comprising a semiconductor substrate support.

6. The apparatus of claim 5, wherein the dispense arm further comprises a vertical actuator to move the gripper vertically towards and away from the semiconductor substrate support.

7. The apparatus of claim 3, wherein the dispense arm has a relatively larger curved side upper portion opposite a relatively smaller curved side lower portion.

* * * * *